United States Patent
Sevenhans et al.

(10) Patent No.: US 6,323,729 B1
(45) Date of Patent: Nov. 27, 2001

(54) AMPLIFIER ARRANGEMENT WITH VOLTAGE GAIN AND REDUCED POWER CONSUMPTION

(75) Inventors: Joannes Mathilda Josephus Sevenhans, Brasschaat; Jan Servaes, Hoogstraten, both of (BE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/448,763

(22) Filed: Nov. 24, 1999

(30) Foreign Application Priority Data

Dec. 14, 1998 (EP) .................................................. 98403167

(51) Int. Cl.$^7$ ........................................................ H03F 1/14
(52) U.S. Cl. ............................. 330/51; 330/133; 330/134; 330/297; 330/310
(58) Field of Search .............................. 330/51, 133, 134, 330/297, 310

(56) References Cited

U.S. PATENT DOCUMENTS

| | | | |
|---|---|---|---|
| 4,401,954 | 8/1983 | Suzuki | 330/297 |
| 5,258,653 | 11/1993 | Perry | 307/74 |
| 5,745,857 | 4/1998 | Statz et al. | 381/120 |

FOREIGN PATENT DOCUMENTS

| | | |
|---|---|---|
| 0 509 113 A1 | 10/1992 | (EP) . |
| WO 96/12342 | 4/1996 | (WO) . |

OTHER PUBLICATIONS

Holt "Electronic Circuits Digital and Analog" John Wiley & Sons, Inc., 1978, p. 500.*
Savant et al. "Electronic Circuit Design An Engineering Approach" The Benjamin/Cummings Publishing Company, Inc., 1987, p 289.*
Saether, T. et al.: "High Speed, High Linearity CMOS Buffer Amplifier" IEEE Journal of Solid–State Circuits, vol. 31, No. 2, Feb. 1, 1996, pp. 255–258, XP000597212.
"Average Efficiency of Class–G power amplifiers", F.H. Raab, IEEE Transactions on Consumer Electronics, vol. CB–32, Nr 2, Mary 1986.

* cited by examiner

Primary Examiner—Michael B Shingleton
(74) Attorney, Agent, or Firm—Sughrue, Mion, Zinn, Macpeak & Seas, PLLC

(57) ABSTRACT

An amplifier arrangement includes a first amplifier powered by a pair of lower voltage power supplies, a second amplifier powered by a pair of higher voltage power supplies and a drive control device. This amplifier arrangement has both current and voltage gain larger than one. The drive control device includes a regulating device adapted to switch off the first amplifier based on the output signal of the amplifier arrangement, and at least one current link and at least one voltage controlled current source. The transition between the operation of the first and second amplifiers is thereby controlled by the values of the currents of these at least one current links and the at least one voltage controlled current sources.

22 Claims, 4 Drawing Sheets

AMPLIFIER ARRANGEMENT WITH VOLTAGE GAIN AND REDUCED POWER CONSUMPTION

BACKGROUND OF INVENTION

The present invention relates to an amplifier arrangement. Similar amplifier arrangements are already known in the art, such as *"Average efficiency of class-G power amplifiers"*, written by F. H. Raab, *IEEE Transactions on Consumer Electronics,* Vol CB-32, Nr May 2, 1986. Therein, class-G power amplifiers are described, including a first amplifier stage powered by a first couple of power supplies, and a second amplifier stage biased by a second couple of power supplies, the absolute value of the voltages delivered by this second couple of power supplies exceeding those of the first couple of power supplies. The output terminals of both amplifiers are coupled together and constitute the output terminal of the class-G amplifier arrangement. Furthermore, as can be observed from FIG. 1 of this prior art article, this class-G power amplifier includes a drive control, which includes an input terminal coupled to the input terminal of the amplifier arrangement, and which includes four output terminals, two of which are coupled to two input terminals of the first amplifier stage, another two of which are coupled to two input terminals of the second amplifier stage. The function of the prior art drive control is to make sure that input signals whose peak amplitudes are between the first and second supply voltages as delivered by the first couple of power supplies, are amplified exclusively by the first amplifier, as is stated in the introductory part of the prior art article, and that for signals of larger amplitude, the drive, which corresponds to the input signal, is switched from the first amplifier to the second one.

Furthermore, as is also further mentioned in this and other prior art documents concerned with class G amplifiers, the amplifiers included in such prior art amplifier arrangements, consist of amplifiers with an emitter follower or source follower transistor configuration. As is well known by a person skilled in the art, such emitter followers have a very low output impedance and a high current amplification, both items being excellent for high current driving of a load.

Yet emitter followers have a very low voltage gain. When such class-amplifiers are used as an output stage of for instance a line driver amplifier configuration, the complete voltage gain of this amplifier configuration is to be provided by the input or pre-amplifier, which precedes the class-G amplifier. Since this pre-amplifier, as a consequence, also has to provide the complete output signal swing, this pre-amplifier is to be supplied by the higher voltage power supplies. This of course increases the current consumption of this preamplifier, while at the same time reducing its linearity.

SUMMARY OF THE INVENTION

An object of the present invention therefore is to provide an amplifier arrangement of the above known kind, but, which when used as an output stage in a larger amplifier configuration, solves the above mentioned drawbacks concerned with the high power consumption and poor linearity behaviour of the pre-amplifier preceding such an amplifier arrangement.

This object is achieved by the fact that the amplifier arrangement of the present invention has voltage gain larger than one.

In this way, by the fact that the amplifier arrangement has a voltage gain larger than one, the preceding pre-amplifier can be powered by the lower voltage power supplies, thereby solving the above mentioned drawbacks of power consumption and linearity in this pre-amplifier.

Another characteristic feature of the present invention is that a first input terminal (DCDIN1) of the drive control device (DCD) is coupled to a first output terminal (DCDOUT1) of the drive control device (DCD), with the drive control device (DCD) further including a third input terminal (DCDIN3) coupled to the output terminal (OUT) of the amplifier arrangement (AA), and a regulating device (D), an input terminal of which is coupled to a third input terminal (DCDIN3) of the drive control device (DCD), an output terminal of which is coupled to a fifth output terminal (DCDOUT5) of the drive control device (DCD), which is further coupled to the first output terminal (OUT1) of the first amplifier (AB), the regulating device (D) thereby being adapted to cut off the first amplifier (AB), based on the value of the output signal at the output terminal (OUT) of the amplifier arrangement (AA).

Thereby, the transition of the operation of the first amplifier to the second one, is controlled by means of the regulating circuit included within the drive control. As a matter of fact, the cited prior art article did not show any details about an actual implementation of such a drive control. In other prior art documents where such class G amplifiers are also described, the second amplifier usually incorporates the first one, such as for instance described in the article *"Highest Efficiency and super quality audio amplifier using MOS power FETS in class G operation"*, written by T. Sampei, S. Ohashi, Y. Ohta and S. Inoue, *IEEE Trans. on Consumer Electronics, Vol.* CE-24, Nr. Aug. 3, 1978. Therein the drive control for switching over from the first amplifier at low supply voltages to the one at high supply voltages and which includes the first one, consists of diodes in the first and second power supply path, as is explicitly shown in FIG. 9 of this prior art document, and includes as well diodes in the input path in order to prevent switchover distortion, as is shown in FIG. 8 of this prior art document. These prior art drive control devices thus control the switchover or transition point based on the voltage at the input signal. However, the use of diodes in the supply voltage path as well as in the input voltage path reduces the signal amplitude, and consequently the dynamic range.

By the regulating device of the drive control of the present invention, switchover of the operation from the first to the second amplifier is based upon the output signal of the amplifier arrangement which controls the cut off of the first amplifier via the output terminal of this first amplifier. No diodes are used in the input signal or supply voltage path because of the direct coupling between the input terminal of the amplifier arrangement and the first amplifier.

Another characteristic feature of the present invention is the drive control device (DCD) further includes a first current link (CL+), an input terminal of which is coupled to the first input terminal (DCDIN1)of the drive control device (DCD), an output terminal of which is coupled to the third output terminal (DCDOUT3) of the drive control device (DCD), the first current link (CL+) being adapted to generate at its output terminal at first current output signal which is dependent on the signal appearing at its input terminal, and which is further proportional to the current delivered at the first output terminal (OUT1) of the first amplifier (AB) in case the first amplifier is active.

The second amplifier is thereby controlled via a current signal which is derived from the input signal by means of the first current link. This allows the second amplifier to be a current amplifier, thus delivering the current gain to the amplifier arrangement.

The fact that the current output signal from the first current link is also dependent on the output current of the first amplifier, allows to regulate the transition from the operation from the first amplifier to the second one.

Yet further characteristic features of the present invention are that the drive control device (DCD) may further include a first voltage controlled current source (IREF1) which is coupled between the third voltage supply terminal (V2+) of the amplifier arrangement (AA) and a first junction point (J1) which is coupled between the output terminal of the first current link (CL+) and the third output terminal (DCDOUT3) of the drive control device (DCD), the current delivered by the first voltage controlled current source (IREF1) being dependent on the voltage at the first junction point (J1), and that the onset of the second amplifier (C) may be determined by the current delivered by the first voltage controlled current source (IREF1) and by the first current output signal generated by the first current link (CL+).

At the first junction point, which acts as a current summation point, the current from the first voltage controlled current source is compared to the output current signal from the first current link. The value of both currents will thereby determine when the second amplifier will become active. Since the output current signal generated by the first current link was dependent on the output current of the first amplifier a smooth transition from the operation of the first amplifier to the second one is thereby obtained.

Another characteristic feature of the present invention is that the first current link may be further coupled to the second supply voltage terminal (V1−) of the amplifier arrangement (AA).

Thereby the current from the first voltage controlled current source, can be sunk via the first junction point, the first current link to the second supply voltage terminal. The current consumption in the first current link is thereby reduced since the second power supply forms part of the lower voltage power supply pair.

Still other characteristic features of the present invention are that the amplifier arrangement (AA) may further include a second input terminal (IN2), the input signal thereby being a differential input signal applied between the first input terminal (IN1) and the second input terminal (IN2) of the amplifier arrangement (AA), the drive control device (DCD) thereby including a second input terminal (DCDIN2) which is coupled to the second input terminal (IN2) of the amplifier arrangement (AA), the second input terminal (DCDIN2) of the drive control device (DCD) being thereby coupled to the second output terminal ( DCDOUT2) of the drive control device (DCD), and that the first amplifier (AB) may further include a second output terminal (OUT2), with the drive control device (DCD) further including a sixth output terminal (DCDOUT6) which is coupled to the second output terminal (OUT2) of the first amplifier (AB), and with the regulating device (D) further including a second output terminal coupled to the sixth output terminal (DCDOUT6) of the drive control device (DCD).

The amplifier arrangement is thereby operating fully differentially, whereby the second amplifier also includes a second output terminal via which the second amplifier can also be cut off by the regulating device.

Yet further characteristic features of the present invention are that the drive control device (DCD) may include a second current link (CL−), an input terminal of which is coupled to the second input terminal (DCDIN2) of the drive control device (DCD), an output terminal of which is coupled to the fourth output terminal (DCDOUT4) of the drive control device (DCD), the second current link (CL−) being adapted to generate at its output terminal a second current output signal which is dependent on the signal appearing at its input terminal, and which is further proportional to the current delivered at the second output terminal (OUT1) of the first amplifier (AB) in case the first amplifier is active. The drive control device (DCD) may further include a second voltage controlled current source (IREF2) which is coupled between the fourth voltage supply terminal (V2−) of the amplifier arrangement (AA) and a second junction point (J2) which is coupled between the output terminal of the second current link (CL), and the fourth output terminal (DCDOUT4) of the drive control device (DCD), the current delivered by the second voltage controlled current source (IREF2) being dependent on the voltage at the second junction point (J2).

Further, the onset of the second amplifier (C) may be further determined by the current delivered by the second voltage controlled current source (IREF2) and by the second current output signal generated by the second current link (CL−), and the second current link (CL−) may be further coupled to the first voltage supply terminal (V1+) of the amplifier arrangement.

Thereby a fully differential solution for the drive control is as well obtained.

The drive control device thereby includes two current links: a first one for sinking a current relative to the input signal at the first input terminal of the amplifier arrangement and proportional to the first output current of the first amplifier, a second one for delivering a current relative to the input signal at the second input terminal of the amplifier arrangement and proportional to the second output current of the first amplifier. The respective currents of these respective current links are then compared, at the first, resp. the second junction point, with the current provided by the first, resp. the second voltage controlled current source. The result of this comparison thereby controls the onset of the first, resp. second, differential part of the second amplifier. The fact that these current links are connected to the lower voltage supplies, again reduces the power consumption in the drive control device, and thus of the complete amplifier arrangement.

The present invention relates as well to a second variant of an amplifier arrangement which is to be used as output stage of amplifiers in a differential output amplifier configuration. In such configuration two amplifiers are used, each having a balanced output terminal. In this case an amplifier arrangement having two output terminals, which are resp. coupled to the two balanced output terminals of the complete amplifier configuration, will allow still simpler embodiments than those used in the single output variant as described above. Within these variant amplifier arrangements, the output terminal of the first amplifier is thus no longer coupled to the output terminal of the second amplifier. The regulating device is thereby coupled between the second output terminal of the amplifier arrangement and the output terminal of the first amplifier. The already mentioned features of the single output amplifier arrangement are also part of such a variant amplifier arrangement.

BRIEF DESCRIPTION OF THE DRAWINGS

The above and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
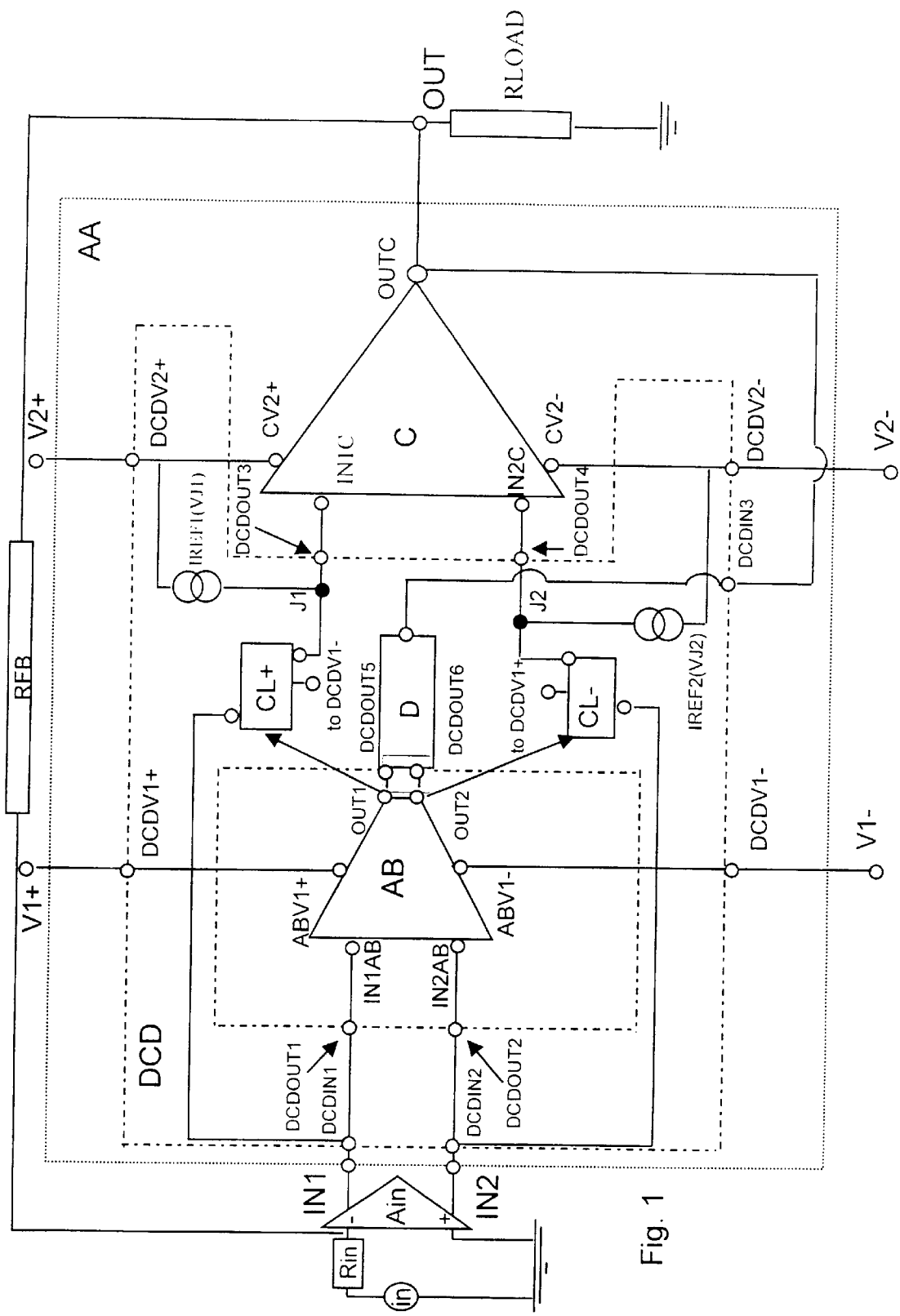
FIG. 1 schematically depicts a first variant of an amplifier arrangement AA according to the invention, and used in a single ended amplifier circuit with feedback and load resistors.

A principal schematic drawing of a first variant of an amplifier arrangement AA according to the present invention is shown in FIG. 1. In this figure, the amplifier arrangement AA forms the output stage of a complete amplifier circuit, composed of a pre-amplifier denoted Ain, coupled via an input resistor Rin to a signal source denoted in, a feedback resistor RFB coupled between the output terminal of the complete amplifier circuit and the input resistor, and an amplifier arrangement AA coupled between the output terminals of the pre-amplifier and the output of the complete amplifier circuit. The output of the complete amplifier circuit, which corresponds to the output terminal of the amplifier arrangement AA, is to be coupled to a load resistor denoted RLOAD. Such an amplifier circuit, is particularly suited for driving signals over low-impedance telephone lines such as in Asymmetrical Digital Subscriber Line, abbreviated with ADSL, applications. Other applications consist of driving loudspeakers in audio amplifiers. For these applications high output drive currents as well as a low output impedance are needed. At the same time the input signal itself has a high crest factor. This means that for short moments, that rarely occur, the input signal peaks at a high voltage, whereas during the majority of the operation the input signal has a lower amplitude. Nevertheless, the output driver circuit has to be able to deliver output signals peaks in response to these rarely occurring input signal peaks. In prior art articles such output driver circuits consisted of the class-G amplifiers. These class-G amplifiers include two amplifiers, a first one operating between a pair of lower voltage power supplies; a second one operating between a second pair of power supplies at a higher voltage level. These amplifiers mainly consisted of emitter or source followers, having a low output impedance, which is beneficial for driving low-impedance loads with high currents. Nevertheless, these emitter-followers have only unity-gain. This means that the pre-amplifier Ain in this case needs to have very high amplification level, whereby the high output signal will thus already appear at the input of the class-G amplifier. For reasons of power consumption and linearity of these pre-amplifiers, it may be however desirable to distribute the amplification factor over both the input and output stage, while still maintaining low power consumption. The amplifier arrangement of the present invention is especially suited for this purpose. The architecture as well as the operation of this amplifier arrangement will now be described into detail.

The amplifier arrangement AA includes a first and a second input terminal, IN1 and IN2 respectively, an output terminal OUT for coupling to a load denoted RLOAD, and 4 supply voltage terminals, respectively denoted V1+, V1−, V2+ and V2−. These supply voltage terminals are adapted to be coupled to four respective power supplies, each delivering a respective supply voltage. In the remainder of this document the value of the supply voltage, delivered by the first power supply which is to be coupled to the first supply voltage terminal V1+ of the amplifier arrangement, will as well be denoted V1+. Similarly the values of the supply voltages delivered by resp. the second, third and fourth power supply, which are to be coupled to resp. the second, third and fourth supply voltage terminals, resp. denoted V1−, V2+ and V2−, will also be respectively denoted V1−, V2+ and V2−.

For these voltage values following conditions apply: V1+ exceeds V1−, V2+ exceeds V2−, the difference between V2+ and V2− is larger than the difference between V1+ and V1−, and there is at least one overlap region between the voltages lying between V1− and V1+ and the voltages lying between V2− and V2+.

In most common embodiments, as was also the case for most prior art class-G amplifiers, V1+ and V1− are symmetrical around the zero reference, as well as V2+ and V2−, with V1+ being smaller than V2+. For instance V1+ can be +5 V, with V1− being accordingly −5V; V2+ may be +15 V, with V2− then being −15 V.

As was the case for the described prior art class-G amplifier arrangements, the subject amplifier arrangement AA includes three major parts. A first part consists of a first amplifier, denoted AB in FIG. 1, and which is powered by the first and second power supplies by coupling these supplies to a first, resp. a second, supply voltage terminal, ABV1+ resp. ABV1−, of this amplifier. This first amplifier includes a first, resp. second, input terminal, resp. denoted IN1AB and IN2AB, and first and second output terminals, respectively denoted OUT1 and OUT2, which are coupled to each other and to the output terminal OUT of the amplifier arrangement, by means of a regulating circuit D which will be described in a further paragraph of this document.

A second major part of the amplifier arrangement AA consists of a second amplifier, denoted C in FIG. 1, and which is powered by the third and fourth power supplies by means of a first, resp. second supply voltage terminal, resp. denoted CV2+ and CV2−, of this second amplifier. This second amplifier includes two input terminals: a first input terminal denoted IN1C, and a second input terminal denoted IN2C. An output terminal OUTC of this second amplifier is as well coupled to the output terminal OUT of the amplifier arrangement AA.

A third major part of the amplifier arrangement is constituted by a drive control device, denoted DCD in FIG. 1. This drive control device DCD is coupled to both input terminals IN1 and IN2 and to the output terminal OUT of the amplifier arrangement via a first, second and third, input terminal, respectively denoted DCDIN1, DCDIN2 and DCDIN3 of this drive control device. This drive control device DCD includes 6 output terminals, denoted DCDOUT1, DCDOUT2, DCDOUT3, DCDOUT4, DCDOUT5 and DCDOUT6 in FIG. 1, and which are respectively coupled to IN1AB and IN2AB being the input terminals of the first amplifier, IN1C and IN2C, which constitute the input terminals of the second amplifier C, and to OUT1 and OUT2 which constitute the output terminals of the first amplifier AB. DCD is powered by all four power supplies by means of a first, second, third and fourth supply voltage terminal, respectively denoted DCDV1+,DCDV1−, DCDV2+ and DCDV2−, and which are respectively coupled to the first, second, third and fourth power supply terminals of the amplifier arrangement AA.

The function of such a drive control device, as was already known from the prior art document, is to accomplish that for small values of the input signal the first amplifier is active while the second amplifier is not active, and that for larger values of the input signal, the second amplifier becomes active, while the first amplifier gets off. In order to guarantee a smooth transition from the operation from one amplifier to the other, a transition region will be foreseen.

In prior art drive control devices this function was accomplished by means of voltage regulation using diodes, both in the input signal path as well as in the supply voltage path. In the subject amplifier arrangement however the above mentioned function of the drive control device is accomplished by means of the following major building blocks:

a regulating device D coupled between DCDIN3 and DCDOUT5 and DCDOUT6, and adapted to cut off the first amplifier for values of the output signal being larger than approximately V1+ or lower than approximately V1−, first and second current links, resp. denoted CL+ and CL−, and coupled between resp. input terminals DCDIN1 and DCDIN2, and respective output terminals DCDOUT3 and DCDOUT4. Each of these current links is adapted to generate, from their applied input signal, which corresponds to a differential input signal of the amplifier arrangement, a current output signal. This current output signal is thereby further proportional to the current delivered or sunk by one respective output terminal of the first amplifier, when this first amplifier is active. This is indicated by means of the arrows between the output terminals of the first amplifier and the current links. When the first amplifier is off, the current output signal produced by the current links, is merely a function of their input signals. In the drawing of FIG. 1, a correspondence between the current sunk by CL+ and the current delivered at OUT1, and a correspondence between the current delivered by CL− and the current sunk at OUT2 is respectively depicted. As will become clear from other specific embodiments, a correspondence between the current sunk by CL+ and the current flowing in OUT2, as well as a correspondence between the current delivered by CL− and OUT1 can be realised. In general, these currents, resp. delivered by and sunk from OUT1 and OUT2, are symmetrical around the reference current biasing point of the arrangement, this point in general corresponding to a zero output potential at the arrangement output terminal OUT. The first current link CL+ is adapted to sink this first current link output current from its output terminal, which is coupled to DCDOUT3, to the first power supply terminal DCDV1− of the drive control device; the second current link is adapted to deliver this second current link output current from DCDV1+ to its output terminal which is coupled to DCDOUT4.

first and second voltage controlled current sources, respectively denoted IREF(VJ1) and IREF(VJ2). Remark that on the drawing of FIG. 1 the symbol used for indicating these voltage controlled current sources is the symbol generally used for indicating fixed current sources, in order to clarify the operation of the drive control device, as will become more clear from a further paragraph. The first voltage controlled current source, denoted IREF(VJ1) is coupled between DCDV2+ and DCDOUT3, while the second voltage controlled current source IREF(VJ2) is coupled between DCDV2− and DCDOUT4. As a matter of fact, both DCDOUT3 and DCDOUT4 thereby constitute a current summation or junction point for the currents delivered from the first voltage controlled current source and sunk by the first current link, and the currents sunk by the second voltage controlled current source and delivered by the second current link respectively. These junction points are explicitly indicated in the drawing of FIG. 1 as J1 and J2 respectively. The respective resultant currents will either drive or turn off the second amplifier C, as will be further explained in a following paragraph of this document. It is obvious that the currents delivered or sunk by the current links, the currents delivered by the first amplifier, and the currents delivered by the current source thereby have to comply to certain boundary conditions, in order to guarantee a smooth and adequate transition from the operation of the first amplifier to the second one. These relationships will also be further discussed in this following paragraph of this document.

An additional remark is that the input signals as appearing between the input terminals IN1 and IN2 of the amplifier arrangement, the latter being coupled to the first and second input terminals of the drive control device, are straightforwardly delivered to the input terminals of the first amplifier. Thus the coupling between the first input and output terminals of the drive control device merely consists of a galvanic or metal connection. The same is true for the second input and output terminals of this drive control device.

Figure 2:
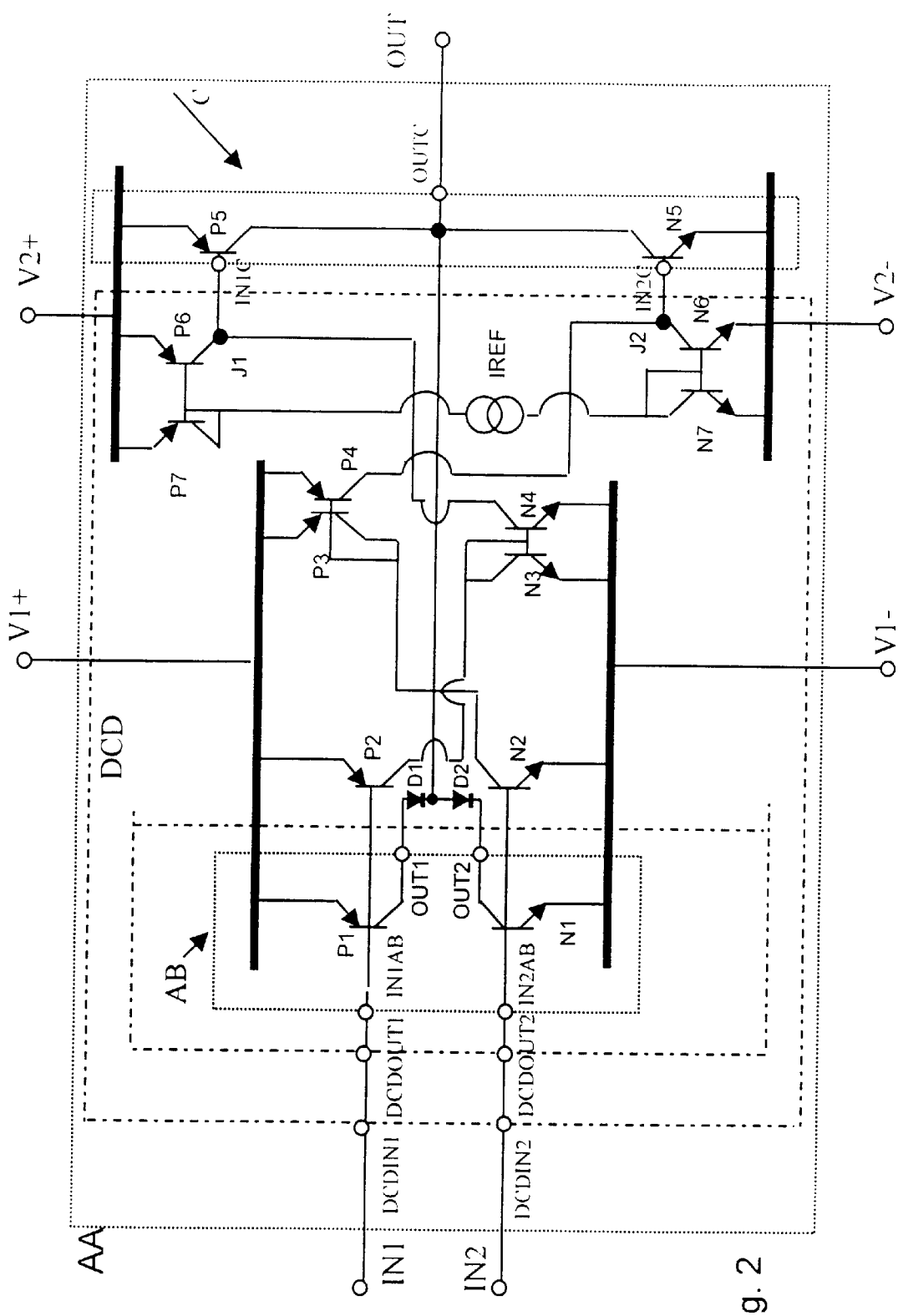
FIG. 2 depicts an embodiment using bipolar transistors of such an amplifier arrangement as shown in FIG. 1, FIG. 3 schematically shows the output current of the amplifier arrangement AA as a function of a sinusoidal voltage input signal. The transition regions between the operation of the two amplifiers are as well indicated.

FIG. 2 shows a detailed embodiment of this first variant of the amplifier arrangement of the schematic shown in FIG. 1. In order to not overload the drawing of FIG. 2, not all terminal connections of FIG. 1 are indicated, but they will be referred to in this part of the description. An additional remark to be made with this figure is that bipolar transistors are used for this embodiment. However an embodiment wherein each pnp transistor is replaced with a p-type field-effect transistor and wherein each npn transistor is replaced with a n-type field effect transistor may as well be used for implementing the circuit of FIG. 2. In the remainder of this paragraph the explanation will be given for the case of bipolar transistors. This will be followed by a short discussion indicating the similarities and the differences for the embodiment using field-effect transistors.

The first amplifier AB shown in FIG. 2 is a very simple class AB amplifier, including merely a first p-type transistor, denoted with P1, and a first n-type transistor, denoted with N1. The control terminal of the p-type transistor constitutes the first input terminal of the amplifier AB, denoted IN1AB, which is as well coupled to the first output terminal DCDOUT1 of the drive control device, the first input terminal DCDIN1 of this drive control device, and to the first input terminal IN1 of the amplifier arrangement AA. Similarly the control terminal of the n-type transistor N1 constitutes the second input terminal IN2AB of the first amplifier, which is coupled to the second output terminal DCDOUT2 of the drive control device, the second input terminal DCDIN2 of this drive control device, and the second input terminal IN2 of the amplifier arrangement AA.

The collector terminal of P1 constitutes the first output terminal OUT1 of the first amplifier AB, whereas the collector terminal of N1 constitutes the second output terminal OUT2 of the first amplifier AB.

The first amplifier is coupled between the first and second power supply terminals of the amplifier arrangement, respectively denoted V1+ and V1−. The respective thick lines, respectively coupled to V1+ and V1− thereby constitute the first and second power supply terminals ABV1+ and ABV1− of AB.

The second amplifier C of the amplifier arrangement AA embodiment shown in FIG. 2 is also a very simple class C amplifier and consists of a p-type transistor P5, in series with an n-type transistor N5. The control terminal of P5 thereby constitutes the first input terminal IN1C of the second amplifier; the control terminal of N5 constitutes the second input terminal IN2C of the second amplifier. The collector terminals of both transistors P5 and N5 and connected together, and constitute the output terminal OUTC of the second amplifier, as well as the output terminal OUT of the amplifier arrangement. The second amplifier C is powered by the third and fourth power supplies, coupled to the third and fourth supply voltage terminals of the amplifier arrangement, resp. denoted V2+ and V2−. The thick lines in FIG. 2, respectively coupled to V2+ and V2− thereby constitute the first and second supply voltage terminals, CV2+ and CV2− of the second amplifier C.

The drive control device DCD of FIG. 2 includes a regulating device, formed in the embodiment shown in FIG. 2 by the two diodes D1 and D2 which are cascaded between the two collector output terminals of the first amplifier AB. The intersection point between the two diodes is thereby coupled to the output terminal OUT of the amplifier arrangement and constitutes the third input terminal DCDIN3 of the drive control device, whereas the forward terminal of D1 coupled to the collector of P1 constitutes the sixth output terminal DCDOUT6 of DCD, and the blocking terminal of D2, coupled to the collector of N1, constitutes the fifth output terminal DCDOUT5 of DCD as indicated in FIG. 1.

The drive control device DCD further includes first and second current links, CL+ and CL−, respectively formed by transistors P2, N3 and N4 for CL+, and transistors N2, P3 and P4 for CL−. The input terminal of CL+ corresponds to the control terminal of P2 which is a p-type transistor with an emitter terminal coupled to V1+, a control or base terminal coupled to the input terminal DCDIN1 of the drive control device, and a collector terminal coupled to the interconnected control terminals of current mirror transistors N3 and N4. The latter are n-type transistors, the emitter terminals of which are coupled to V1−. The collector terminal of N3 is thereby coupled to its control terminal. N3 thus acts as a diode. Since the base-emitter bias of N3 is exactly the same as that of N4, the emitter-collector current in N4 can be made the same or proportional to that of N3 by carefully selecting both transistors, e.g. by designing or layouting them such that the emitter dimensions of N4 are proportional to those of N3, while keeping the remainder of the transistor dimensions identical, in case the amplifier arrangement forms part of an integrated circuit. The same holds for transistors P1 and P2. Since the current in P2 is thus proportional to the current in P1, which equals the current in N3, and since the current in N4 is proportional to the current in N3, the current thus flowing in N4 is proportional to the current flowing in P1. Thus the output current of the first current link, constituted by P2,N3 and N4, is proportional to the output current of the first output terminal OUT1 of the first amplifier AB, for this embodiment. The collector terminal of N4 constitutes the output terminal of the current link CL+. This terminal is coupled to the first junction point J1, which is coupled to the third output terminal DCDOUT3 of the drive control device. This third output terminal DCDOUT3 is thereby coupled to the first input terminal IN1C of the second amplifier C.

Similarly the control terminal of N2, constituting the input terminal of the second current link CL−, is coupled to the second input terminal DCDIN2 of the drive control device, whereby its emitter terminal is coupled to V1−. Thus the base-emitter voltage of N2 is exactly the same as that of N1. For matched transistors, or transistors thus designed that for instance the emitter area of N2 is proportional to that of N1, with all other layout parameters kept the same, the current delivered by N2 is thus proportional to the current delivered by N1.

Since the collector of N2 is coupled to the collector of P3, whereby P3 acts as a diode since its collector is coupled to its base, and its emitter is coupled to V1+, the current flowing through N2 is also flowing through P3. P4 again acts as a current mirror for P3 since their base or control terminals are connected together, as well as their emitter terminals. By carefully tuning both layouts, the current flowing through P4 can thus also be made proportional to the current flowing through P3. The collector terminal of P4 constitutes the output terminal of CL−, the current thus delivered by CL− being proportional to the current flowing through N1, being the output current flowing into the second output terminal OUT2 of AB.

The collector terminal of P4 is coupled to the second junction point J2, which is further coupled to the fourth output terminal DCDOUT4 of the drive control device, and to the second input terminal IN2C of the second amplifier C.

In the embodiment depicted in FIG. 2, the first and second voltage controlled current sources, IREF1(VJ1) and IREF2(VJ2) are part of one common circuit, formed by transistors P6,P7, N6,N7 and one constant current source IREF. The first voltage controlled current source IREF1(VJ1) of FIG. 1 is thereby composed of transistors P6,P7, N7 and the current source IREF. The second voltage controlled current source IREF2(VJ2) of FIG. 1 is composed of transistors P7,N7 and N6 and of current source IREF. Since the functioning of both voltage controlled current sources IREF1(VJ1) and IREF2(VJ2) is very similar, the explanation will only be given for IREF1 (VJ1).

Transistors P7 and N7 are acting as diodes since their collector terminals are connected to their base terminals, and since their base-emitter junction is forwardly biased by the fact that the emitter of P7 is coupled to V2+ and the emitter of N7 is coupled to V2−. In between their collector terminals a fixed current source, IREF, is coupled. The current flowing through P7 and N7 thus equals the current delivered by this fixed current source, which is also denoted IREF. Transistor P6 acts as a current mirror for P7 since their base terminals as well as their emitter terminals, are connected together. For identical transistors P6 and P7, the current delivered by the collector of P6 is thus equal to IREF. This current is flowing to junction point J1. To that junction point J1, also the base current from P5 is delivered, the sum of both currents then being sunk by N4, being the output transistor of CL+, as is well known from the second law of Kirchoff.

Following equation thus applies:

$$IREF + Ib_{P5} = I_{CL+} \quad (1)$$

whereby $Ib_{P5}$ denotes the base current from P5

$I_{CL+}$ denotes the collector current of N4, being the current sunk by the first current link CL+

Since $I_{CL+}$ was proportional to the output current delivered by the first output terminal OUT1 of AB, and denoted Iout1, by a proportionality constant denoted k, equation (1) becomes $$IREF + Ib_{P5} = k \cdot Iout1 \quad (2)$$

In the transition region where both amplifiers AB as well as C are active, the collector-emitter current through P5 equals the base current through P5, multiplied with the current amplification factor, denoted $\beta_{P5}$. Both currents Iout1, as well as the emitter-collector current of P5 are, during the transition region, flowing into resistor RLOAD. At the beginning of the transition region, the current through P5 starts flowing from zero. At that point the base current of P5 is also zero and following equation is thus valid:

$$IREF = k \cdot Iout1 \quad (3)$$

The end of the transition region is defined as the point where the current from the first amplifier becomes zero. Since the cut off of the first amplifier is obtained when one of both diodes D1 or D2 blocks the output current in OUT1 or OUT2 from flowing to OUT. At than point following equation holds:

$$V_{OUT} + V_{D1} = V1+ \quad (4)$$

with $V_{OUT}$ corresponding to the voltage at the terminal OUT with $V_{D1}$ corresponding to the forward biasing voltage across a diode, around 0.7 V.

Indeed, whenever the output signal at the output of the arrangement exceeds V1+ minus a diode voltage, the diode will block currents flowing from V1+ via P1 to the output terminal OUT. The output current of the transistor P1, and consequently of the first amplifier, will thus be reduced to zero from that point on.

From that point on, only the second amplifier C will be active and deliver an output current which is given by the following equation:

$$Iout = \beta_{P5}(k' \cdot I_{P2} - IREF) \quad (5)$$

Whereby $I_{P2}$ denotes the current flowing in transistor P2, k' denotes the proportionality constant between the currents flowing in P2 and N4

$\beta_{P5}$ denotes the current amplification factor of transistor P5.

By means of the feedback realised by the feedback resistor RFB, which is shown in FIG. 1, but not in FIG. 2, the transition between all regions occurs smoothly. It further needs to be remarked that the first amplifier acts as a class AB amplifier, such that also around the zero reference bias point a small DC current is flowing, in order to avoid cross-over distortion. A person skilled in the art is adapted to select the dimensions of all these transistors, shown in FIG. 1, and their zero-signal biasing points such that a class AB operation is obtained. Since this is not really relevant to the invention, this aspect will not be further discussed into detail.

Until now all equations were given for the first current link and first voltage controlled current source, thus for negative excursions of the input signal, resulting in a positive excursion of the output signal. Because of the symmetry of the complete amplifier arrangement, similar equations are also valid for positive excursions of the input signal. A person skilled in the art can easily adapt equations (1) to (5) for this case.

By carefully tuning the transistors in both amplifiers such that the currents generated by the p-type transistors for negative excursions of the input signal are exactly the same as the currents generated by the n-type transistors for positive excursions of the input signal, this symmetry is obtained. A person skilled in the art is further adapted how to obtain such symmetry, e.g. by again tuning the dimensions of transistors P5 and N5 and P1 and N1, such that the inherent difference in the current amplification factor between npn and pnp transistors is compensated for by means of the dimensions of the transistors.

Figure 3:
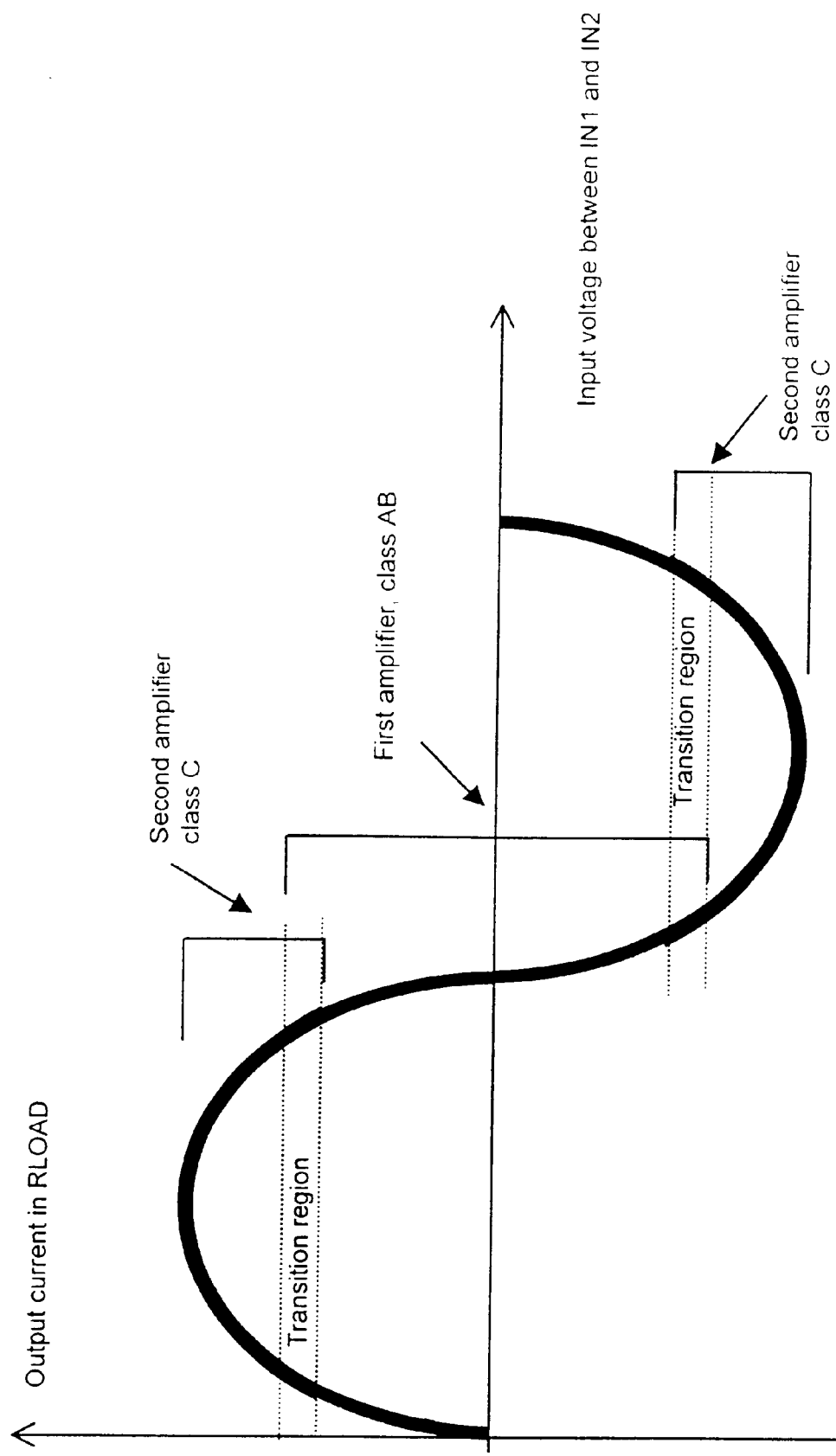

FIG. 3 schematically shows the 3 regions of operation of the amplifier arrangement: a first region where only the first amplifier AB is active, a second region, being the transition region, where both amplifiers AB and C are delivering currents to the output terminal, and a third region where only the second amplifier is active.

In the region where only the first amplifier AB is active, thus for low values of the input signal, resulting in values of the output signal amplitude beneath approximately V1+, the second amplifier is off. This can be understood by the operation of the voltage controlled current sources. Indeed, in this region the output current of the first amplifier is such that its mirrored value produced by the current links is lower than the reference current. For the first current link coupled to the first voltage controlled current source, the reference current IREF can no longer be sunk by N4. The current flowing through P6 is thus to be reduced. Since the base-emitter voltage of P6 is still around 0.7 V, via the coupling with P7, the current in P6 can only be reduced by diminishing the collector-emitter voltage, thereby pushing the bipolar transistor into its saturation of triode region. The collector-emitter voltage across P6 is thereby reduced beneath 0.7 V, resulting in the base-emitter voltage of P5 to be cut off. As a consequence the second amplifier is off.

It is obvious that the same explanation is valid for the second voltage controlled current source, coupled to the second current link and to transistor N5.

Remark that with this configuration, the emitter-base breakdown problem, which was inherent to the emitter-follower topology combined with the diodes in the lower supply voltage path of the prior art class G amplifiers, is no longer present. Indeed, both amplifiers, AB as well as C have collector outputs. Since it is well known to a person skilled in the art that with present state of the art bipolar technologies the collector-base reverse breakdown voltage is much higher that the emitter-base breakdown voltage, this circuit thus presents an extra advantage with respect to the prior art ones.

The explanation given until now was valid for the case of bipolar transistors. In the schematic of FIG. 2 all bipolar npn, resp. pnp, transistors can be replaced by n-type, resp. p-type, field effect transistors. Remark that for field effect transistors, the proportionality factor between current flowing in transistors is obtained by the adapting the dimensions of the gate area, more in particularly the ratio between the width and the length of the gate area.

A further remark which needs to be made for the case of field effect transistors, and more in particular metal-oxide-field effect transistors, abbreviated with MOS transistors, is that these transistors cannot conduct DC currents at their control terminal. Thus the current difference between the voltage controlled current source and the current link cannot drive the second amplifier since the input impedance is infinite for MOS transistors. The circuit as shown in FIG. 2 however still works in case all npn transistors are replaced by NMOS, and all pnp transistors are replaced by PMOS ones, by the fact that current source transistors P6 ad N6 have a finite output resistance. The current difference is, by means of this output or drain resistance, translated into a voltage difference at the drain of P6 or N6, in order to adjust this transistor to the current imposed by the current link. Since this drain is coupled to the gate of P5 or N5, this difference in voltage will thus drive the second amplifier.

Figure 4:
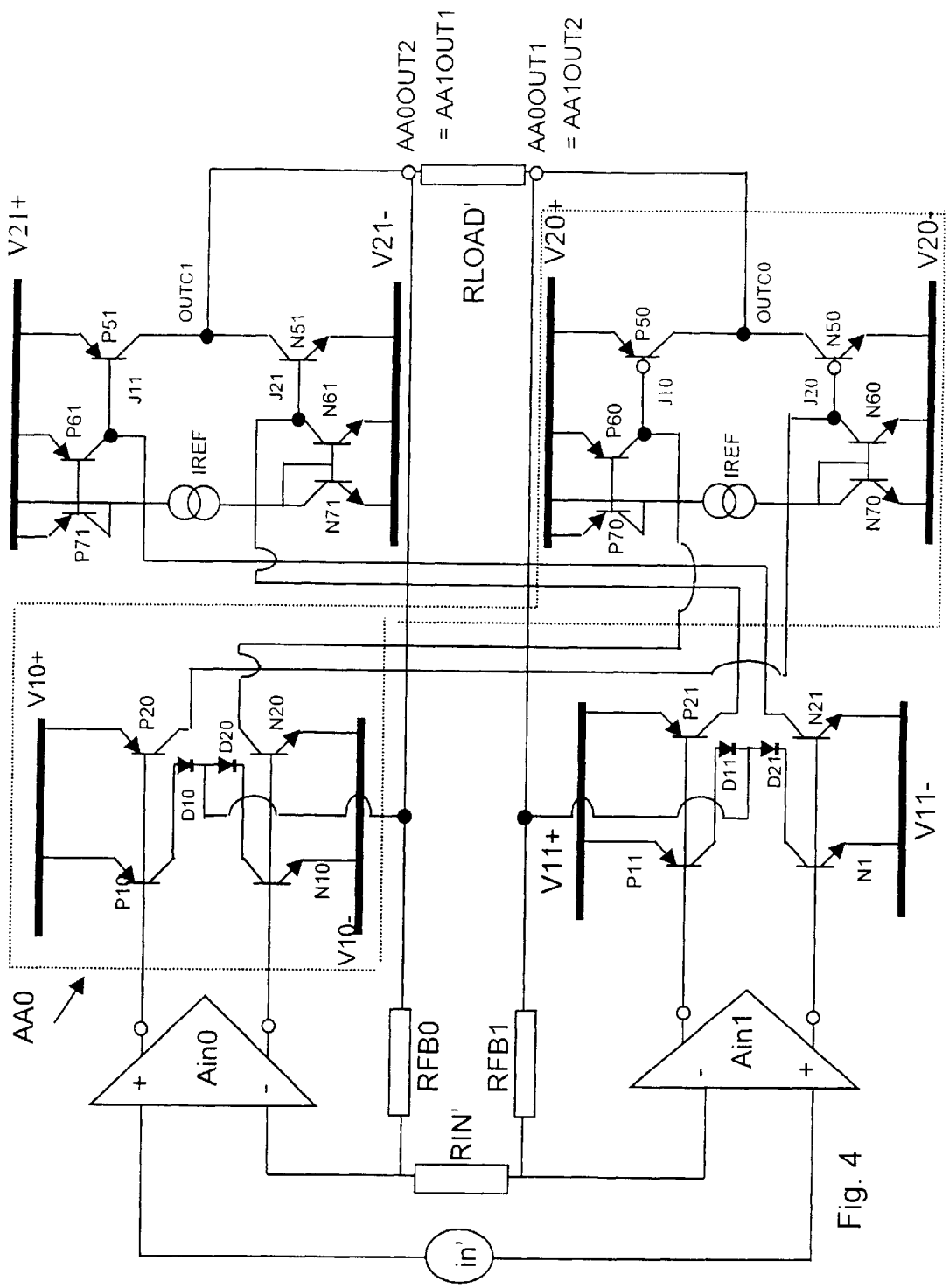
FIG. 4 depicts two embodiments of a second variant of an amplifier arrangement according to the invention, and used in a differential output amplifier configuration with load and feedback resistors.

FIG. 4 shows an embodiment of a second variant of an amplifier arrangement according to the present invention, but this time used in a differential output amplifier configuration. As is well known by a person skilled in the art, such a differential output amplifier includes two pre-amplifiers, denoted Ain0 and Ain1, two inputs of which are coupled by means of an input resistor Rin', two other inputs of which respectively receive the input signal from an input signal source in'. The first pre-amplifier Ain0 output terminals are coupled to a first one of a second variant amplifier arrangement denoted AA0, the second pre-amplifier output terminals are coupled to a second one of this second variant amplifier arrangement. These second variants of FIG. 4 have an identical structure, their architecture being slightly different from the one shown in FIG. 2.

For the first amplifier arrangement AA0, the first amplifier included therein, is composed of a p-type transistor P10, coupled via two cascaded diodes, which constitute the regulating device of the drive control device, to an n-type transistor N10. The second amplifier of AA0 is constituted by p-type transistor P50 in series with n-type transistor N50. The output terminal OUTC0 of this second amplifier is coupled to a first output terminal, denoted AA0OUT1, of the amplifier arrangement AA0. The first amplifier of AA0 is powered by the lower voltage power supplies, with voltages V1+ and V1−, via resp. power supply terminals V10+ and V10−; the second amplifier of AA0 is powered by the higher voltage power supplies, at voltages V2+ and V2−, via respective power supply terminals V20+ and V20−. The drive control device is powered by all four supplies, and includes, besides the already mentioned regulating device, two voltage controlled current sources, which again form part of one common circuit composed of p-type transistors P70,P60, n-type transistors N70, N60 and one constant current source IREF.

As can be observed from FIG. 4, the intersection point between the two diodes D10 and D20, constituting the input terminal of the regulating device, is not coupled to the first output terminal AA0OUT1 of AA0, but to a second output terminal denoted AA0OUT2. Both output terminals constitute the output terminals of the differential output amplifier, between which the load resistor RLOAD' is also coupled. Remark that the first output terminal AA0OUT1 of AA0 is coupled, via a first feedback resistor RFB1 to the second pre-amplifier Ain1, whereas the second output terminal AA0OUT2 of AA0 is coupled via a second feedback resistor RFB0, to the first pre-amplifier Ain0.

Besides the additional output terminal, another difference between the amplifier arrangement AA of FIG. 2 and the amplifier arrangement AA0 of FIG. 4, is concerned with the current links, as well as with the couplings to these current links. In FIG. 2 the current links, for instance CL+, were composed of a first current mirror transistor, being P2 for CL+, for mirroring an output current of the first amplifier, followed by a second current mirror circuit, consisting of N3 and N4 for CL+ of FIG. 2. In FIG. 4, the current links merely include one current mirror transistor for mirroring one of the currents from the first amplifier. This transistor is P20 for mirroring the current of P10, being the current flowing in the first output terminal of the first amplifier. Similarly N20 mirrors the current of N10, sinking the current of a second output terminal of the first amplifier of AA0. The collector or output terminal of current link transistor P20 is now coupled directly to junction point J20, which constitutes the second input terminal of the second amplifier. Similarly the collector or output terminal of current link transistor N20 is coupled to the junction point J10 which is coupled to the first input terminal of this second amplifier. In the first embodiment of FIG. 2 the output terminal of the first current link CL+, was coupled to the first junction point J1 which was coupled to a first input terminal IN1C of the second amplifier. The reason why in this second variant of the amplifier arrangement no additional current mirrors are necessary is indeed linked with the cross-coupling of these current links and with the fact that the output signal appearing at AA0OUT2, delivered by the first amplifier, is not inverted with respect to the input signal, being in contrast to the output signal appearing at AA0OUT1, which is inverted. In the embodiment of FIG. 2, both the first and second amplifier voltage output signal were inverted with respect to the input signal. The second current mirror of the current links of FIG. 2, for instance composed of transistors N3 and N4 in the first current link CL+, had therefore to perform another inversion function which is no longer necessary in the second differential output variant AA0.

The second amplifier arrangement of this second variant shown in FIG. 4, although not explicitly indicated in order not to overload the drawing, includes a first amplifier composed of transistors P11 and N11. The collector terminals of both transistors are coupled via diodes D11 and D21, the intersection point of both diodes constituting the second output terminal AA1OUT2 of this second amplifier arrangement AA1. The second output terminal AA1 OUT2 of this second amplifier arrangement, corresponds to the first output terminal AA0OUT1 of the first amplifier arrangement AA0. The second amplifier of AA1 is composed of transistors P51 and N51, the collector terminals of both transistors being coupled together and constituting the output terminal OUTC1 of the second amplifier and the first output terminal AA1OUT1, of this second amplifier arrangement AA1. The first amplifier is again powered by the lower voltage power supplies, at voltages V1+ and V1−, via respective terminals V11+ and V11−, whereas the second amplifier is powered by the higher voltage power supplies, with voltages V2+ and V2−, via respective terminals V21+ and V21−. The drive control device of the second amplifier arrangement is powered by all four power supplies, and includes besides the regulating device which consists of the two already mentioned cascaded diodes D11 and D21, a circuit composed of transistors P71, P61, N71 and N61, and of a constant current source IREF. This circuit is again basically the same as the one shown in FIG. 2, or the one used in AA0 of FIG. 4 for providing the voltage controlled current sources between the high voltage power supply terminals and the junction points.

The current links of this second amplifier arrangement again merely consist of one current mirror transistor, being P21 for the current link coupled to the first input terminal, and N21 for the other current link coupled to the second input terminal of this amplifier arrangement. The output terminal of a first current link, being the collector terminal of P21, is coupled to junction point J21 which is further coupled to the second input terminal of the second amplifier; the output terminal of the second current link, being the collector terminal of N21, is coupled to junction point J11 which is further coupled to the first input terminal of the second amplifier.

Since the operation of both amplifier arrangements AA0 and AA1 is very similar to the already described operation of amplifier arrangement AA of FIG. 2, this will not be repeated. A person skilled in the art can easily derive the similar equations for defining the transition regions for the embodiments shown in FIG. 4. The main differences are the regulating devices which control the first amplifier, via the second output terminal of the arrangement, whereas the current link proportionality factor is now merely a matter of controlling the dimensions of 2 transistors in stead of 4.

The same remarks concerning the replacement of the pnp transistors with p-type field effect transistors, and the npn transistors with n-type field effect transistors, as those give for the embodiments of FIG. 2, are now also valid for the embodiment depicted in FIG. 4.

While the principles of the invention have been described above in connection with specific apparatus, it is to be clearly understood that this description is made only by way of example and not as a limitation on the scope of the invention, as defined in the appended claims.

What is claimed is:

1. Amplifier arrangement (AA) having a current gain larger than one and having a voltage gain larger than one comprising:

a first input terminal (IN1) coupled to a first input terminal (DCDIN1) of a drive control device (DCD) included in said amplifier arrangement (AA), said drive control device (DCD) including a first output terminal (DCDOUT1) coupled to a first input terminal (IN1AB) of a first amplifier (AB) included in said amplifier arrangement (AA), said drive control device (DCD) further including a second output terminal (DCDOUT2) coupled to a second input terminal (IN2AB) of said first amplifier (AB), a third output terminal (DCDOUT3) coupled to a first input terminal (IN1C) of a second amplifier (C) included in said amplifier arrangement (AA), and a fourth output terminal (DCDOUT4) coupled to a second input terminal (IN2C) of said second amplifier (C), a first output terminal (OUT1) of said first amplifier (AB) being coupled to an output terminal (OUTC) of said second amplifier (C) and to an output terminal (OUT) of said amplifier arrangement (AA);

a first supply voltage terminal (V1+) coupled to a first supply voltage terminal (ABV1+) of said first amplifier (AB) and adapted to be coupled to a first power supply which delivers a first supply voltage;

a second supply voltage terminal (V1−) coupled to a second supply voltage terminal (ABV1−) of said first amplifier (AB) and adapted to be coupled to a second power supply which delivers a second supply voltage which is more negative with respect to said first supply voltage;

a third supply voltage terminal (V2+) coupled to a first supply voltage terminal (CV2+) of said second amplifier (C) and adapted to be coupled to a third power supply which delivers a third supply voltage;

a fourth supply voltage terminal (V2−) coupled to a second supply voltage terminal (CV2−) of said second amplifier (C) and adapted to be coupled to a fourth power supply which delivers a fourth supply voltage which is more negative with respect to said third supply voltage;

whereby the difference between said third supply voltage and said fourth supply voltage exceeds the difference between said first supply voltage and said second supply voltage, whereby said second supply voltage is more positive with respect to than said fourth supply voltage or said first supply voltage is lower than said third supply voltage, said drive control device (DCD) being adapted to control the operation of said first amplifier (AB) and of said second amplifier (C) based on the level of an input signal applied to said input terminal (IN1) and said drive control device (DCD) further includes a first current link (CL+), an input terminal of which is coupled to said first input terminal (DCDIN1) of said drive control device (DCD), an output terminal of which is coupled to said third output terminal (DCDOUT3) of said drive control device (DCD), said first current link (CL+) being adapted to generate at its output terminal a first current output signal which is dependent on the signal appearing at its input terminal, and which is further proportional to the current delivered at said first output terminal (OUT) of said first amplifier (AB) in case said first amplifier is active.

2. An amplifier arrangement (AA0) having a current gain larger than one and having a voltage gain larger than one, comprising:

a first input terminal coupled to a first input terminal of a drive control device included in said amplifier arrangement (AA0), said drive control device including a first output terminal coupled to a first input terminal of a first amplifier included in said amplifier arrangement, said drive control device further including a second output terminal coupled to a second input terminal of said first amplifier, a third output terminal coupled to a first input terminal of a second amplifier included in said amplifier arrangement (AA0), and a fourth output terminal coupled to a second input terminal of said second amplifier, said first amplifier further including a first output terminal, said second amplifier further comprising a first output terminal (OUTC0) which is coupled to a first output terminal (AAOUT01) of said amplifier arrangement (AA0), said amplifier arrangement (AA0) further includes a second output terminal (AAOUT02) which is coupled to said first output terminal of said first amplifier;

a first supply voltage terminal (V10+) coupled to a first supply voltage terminal of said first amplifier and adapted to be coupled to a first power supply which delivers a first supply voltage;

a second supply voltage terminal (V10−) coupled to a second supply voltage terminal of said first amplifier and adapted to be coupled to a second power supply which delivers a second supply voltage which is more negative with respect to said first supply voltage;

a third supply voltage terminal (V20+) coupled to a first supply voltage terminal of said second amplifier and adapted to be coupled to a third power supply which delivers a third supply voltage;

a fourth supply voltage terminal (V20−) coupled to a second supply voltage terminal of said second amplifier and adapted to be coupled to a fourth power supply which delivers a fourth supply voltage which is more negative with respect to said third supply voltage, whereby the difference between said third supply voltage and said fourth supply voltage exceeds the difference between said first supply voltage and said second supply voltage, whereby said second supply voltage is more positive with respect to than said fourth supply voltage or said first supply voltage is lower than said third supply voltage, said drive control device being adapted to control the operation of said first amplifier and of said second amplifier based on the level of an input signal applied to said input terminal, and said drive control device further includes a first current link, an input terminal of which is coupled to said first input terminal of said drive control device, an output terminal of which is coupled to said third output terminal of said drive control device, said first current link being adapted to generate at its output terminal a first current output signal which is dependent on the signal appearing at its input terminal, and which is further proportional to the current delivered at said first output terminal (OUT1) of said first amplifier in case said first amplifier is active.

3. Amplifier arrangement (AA) according to claim 1 characterised in that said first input terminal (DCDIN1) of said drive control device (DCD) is coupled to said first output terminal (DCDOUT1) of said drive control device (DCD), said drive control device (DCD) further includes a third input terminal (DCDIN3) coupled to said output terminal (OUT) of said amplifier arrangement (AA), said drive control device further includes a regulating device (D), an input terminal of which is coupled to said third input terminal (DCDIN3) of said drive control device (DCD), an output terminal of which is coupled to a fifth output terminal (DCDOUT5) of said drive control device (DCD), which is further coupled to said first output terminal (OUT1) of said first amplifier (AB), said regulating device (D) thereby being adapted to cut off said first amplifier (AB), based on the value of the output signal at said output terminal (OUT) of said amplifier arrangement (AA).

4. Amplifier arrangement (AA) according to claim 3, characterised in that said drive control device (DCD) further includes a first voltage controlled current source (IREF1) which is coupled between said third voltage supply terminal (V2+) of said amplifier arrangement (AA) and a first junction point (J1) which is coupled between said output terminal of said first current link (CL+) and said third output terminal (DCDOUT3) of said drive control device (DCD), the current delivered by said first voltage controlled current source (IREF1) being dependent on the voltage at said first junction point (J1).

5. Amplifier arrangement (AA) according to claim 4 characterised in that the onset of said second amplifier (C) is determined by the current delivered by said first voltage controlled current source (IREF1) and by said first current output signal generated by said first current link (CL+).

6. Amplifier arrangement (AA) according to claim 5 characterised in that said first current link is further coupled to said second supply voltage terminal (V1−) of said amplifier arrangement (AA).

7. Amplifier arrangement (AA) according to claim 1 characterised in that said amplifier arrangement (AA) further includes a second input terminal (IN2), said input signal thereby being a differential input signal applied between said first input terminal (IN1) and said second input terminal (IN2) of said amplifier arrangement (AA), said drive control device (DCD) thereby includes a second input terminal (DCDIN2) which is coupled to said second input terminal (IN2) of said amplifier arrangement (AA), said second input terminal (DCDIN2) of said drive control device (DCD) is thereby coupled to second output terminal (DCDOUT2) of said drive control device (DCD).

8. Amplifier arrangement according to claim 3 characterised in that said amplifier arrangement (AA) further includes a second input terminal (IN2), said input signal thereby being a differential input signal applied between said first input terminal (IN1) and said second input terminal (IN2) of said amplifier arrangement (AA), said drive control device (DCD) thereby includes a second input terminal (DCDIN2) which is coupled to said second input terminal (IN2) of said amplifier arrangement (AA), said second input terminal (DCDIN2) of said drive control device (DCD) is thereby coupled to said second output terminal (DCDOUT2) of said drive control device (DCD), said first amplifier (AB) further includes a second output terminal (OUT2), said drive control device (DCD) further includes a sixth output terminal (DCDOUT6) which is coupled to said second output terminal (OUT2) of said first amplifier (AB), and said regulating device (D) further includes a second output terminal coupled to said sixth output terminal (DCDOUT6) of said drive control device (DCD).

9. Amplifier arrangement (AA) according to claim 8 characterised in that said drive control device (DCD) further includes a first current link (CL+), an input terminal of which is coupled to said first input terminal (DCDIN1) of said drive control device (DCD), an output terminal of which is coupled to said third output terminal (DCDOUT3) of said drive control device (DCD), said first current link (CL+) being adapted to generate at its output terminal at first current output signal which is dependent on the signal appearing at its input terminal, and which is further proportional to the current delivered at said first output terminal (OUT1) of said first amplifier (AB) in case said first amplifier is active, and said drive control device (DCD) includes a second current link (CL−), an input terminal of which is coupled to said second input terminal (DCDIN2) of said drive control device (DCD), an output terminal of which is coupled to said fourth output terminal (DCDOUT4) of said drive control device (DCD), said second current link (CL−) being adapted to generate at its output terminal a second current output signal which is dependent on the signal appearing at its input terminal, and which is further proportional to the current delivered at said second output terminal (OUT1) of said first amplifier (AB) in case said first amplifier is active.

10. Amplifier arrangement (AA) according to claim 9 characterised in that said drive control device (DCD) further includes a first voltage controlled current source (IREF1) which is coupled between said third voltage supply terminal (V2+) of said amplifier arrangement (AA) and a first junction point (J1) which is coupled between said output terminal of said first current link (CL+) and said third output terminal (DCDOUT3) of said drive control device (DCD), the current delivered by said first voltage controlled current source (IREF1) being dependent on the voltage at said first junction point (J1), and said drive control device (DCD) further includes a second voltage controlled current source (IREF2) which is coupled between said fourth voltage supply terminal (V2−) of said amplifier arrangement (AA) and a second junction point (J2) which is coupled between said output terminal of said second current link (CL), and said fourth output terminal (DCDOUT4) of said drive control device (DCD), the current delivered by said second voltage controlled current source (IREF2) being dependent on the voltage at said second junction point (J2).

11. Amplifier arrangement (AA) according to claim 10 characterised in that
the onset of said second amplifier (C) is further determined by said current delivered by said second voltage controlled current source (IREF2) and by said second current output signal generated by said second current link (CL−).

12. Amplifier arrangement (AA) according to claim 11 characterised in that
said second current link (CL−) is further coupled to said first voltage supply terminal (V1+) of said amplifier arrangement.

13. Amplifier arrangement (AA) according to claim 2 characterised in that
said first input terminal of said drive control device is coupled to said first output terminal of said drive control device,
said drive control device further includes a third input terminal coupled to said second output terminal of said amplifier arrangement,
said drive control device further includes a regulating device, an input terminal of which is coupled to said third input terminal of said drive control device, an output terminal of which is coupled to a fifth output terminal of said drive control device, and which is further coupled to said first output terminal of said first amplifier, said regulating device thereby being adapted to cut off said first amplifier, based on the value of the output signal at said second output terminal (AAOUT02) of said amplifier arrangement (AA0).

14. Amplifier arrangement (AA0) according to claim 13, characterised in that
said drive control device further includes a first voltage controlled current source (IREF) which is coupled between said third voltage supply terminal (V20+) of said amplifier arrangement (AA0) and a first junction point (J10) which is coupled between said output terminal of said first current link and said third output terminal of said drive control device (DCD), the current delivered by said first voltage controlled current source being dependent on the voltage at said first junction point (J10).

15. Amplifier arrangement (AA0) according to claim 14 characterised in that the onset of said second amplifier is determined by the current delivered by said first voltage controlled current source and by said first current output signal generated by said first current link.

16. Amplifier arrangement (AA0) according to claim 15 characterised in that said first current link is further coupled to said second supply voltage terminal (V10−) of said amplifier arrangement.

17. Amplifier arrangement (AA0) according to claim 16 characterised in that:
said amplifier arrangement further includes a second input terminal, said input signal thereby being a differential input signal applied between said first input terminal and said second input terminal of said amplifier arrangement,
said drive control device thereby includes a second input terminal which is coupled to said second input terminal of said amplifier arrangement,
said second input terminal of said drive control device is thereby coupled to said second output terminal of said drive control device.

18. Amplifier arrangement (AA0) according to claim 17 characterised in that said amplifier arrangement further includes a second input terminal, said input signal thereby being a differential input signal applied between said first input terminal and said second input terminal of said amplifier arrangement,
said drive control device thereby includes a second input terminal which is coupled to said second input terminal of said amplifier arrangement;
said second input terminal of said drive control device is thereby coupled to said second output terminal of said drive control device,
said first amplifier further includes a second output terminal,
said drive control device further includes a sixth output terminal which is coupled to said second output terminal of said first amplifier, and
said regulating device further includes a second output terminal coupled to said sixth output terminal of said drive control device.

19. Amplifier arrangement (AA0) according to claim 18 characterised in that
said drive control device further includes a first current link, an input terminal of which is coupled to said first input terminal of said drive control device, an output terminal of which is coupled to said third output terminal of said drive control device, said first current link being adapted to generate at its output terminal at first current output signal which is dependent on the signal appearing at its input terminal, and which is further proportional to the current delivered at said first output terminal of said first amplifier in case said first amplifier is active, and
said drive control device includes a second current link, an input terminal of which is coupled to said second input terminal of said drive control device, an output terminal of which is coupled to said fourth output terminal of said drive control device, said second current link being adapted to generate at its output terminal a second current output signal which is dependent on the signal appearing at its input terminal, and which is further proportional to the current delivered at said second output terminal of said first amplifier in case said first amplifier is active.

20. Amplifier arrangement (AA0) according to claim 19 characterised in that
said drive control device further includes a first voltage controlled current source which is coupled between said third voltage supply terminal (V20+) of said amplifier arrangement and a first junction point (J10) which is coupled between said output terminal of said first current link and said third output terminal of said drive control device, the current delivered by said first voltage controlled current source being dependent on the voltage at said first junction point, and
said drive control device further includes a second voltage controlled current source which is coupled between said fourth voltage supply terminal (V20−) of said amplifier arrangement and a second junction point (J20) which is coupled between said output terminal of said second current link, and said fourth output terminal of said drive control device (DCD), the current delivered by said second voltage controlled current source being dependent on the voltage at said second junction point.

21. Amplifier arrangement (AA0) according to claim 20 characterised in that the onset of said second amplifier is further determined by said current delivered by said second voltage controlled current source and by said second current output signal generated by said second current link.

22. Amplifier arrangement (AA0) according to claim 21 characterised in that said second current link is further coupled to said first voltage supply terminal (V10+) of said amplifier arrangement.

* * * * *